(12) United States Patent
Tseng et al.

(10) Patent No.: US 8,100,558 B2
(45) Date of Patent: Jan. 24, 2012

(54) LIGHTING DEVICE AND METHOD FOR MAKING THE SAME

(75) Inventors: Ching-Lin Tseng, Taipei Hsien (TW); Ming-Li Chang, Taipei Hsien (TW); Cheng-Chieh Lin, Taipei Hsien (TW)

(73) Assignee: Bright LED Electronics Corp., Taipei Hsien (TW)

( * ) Notice: Subject to any disclaimer, the term of this patent is extended or adjusted under 35 U.S.C. 154(b) by 216 days.

(21) Appl. No.: 12/688,520

(22) Filed: Jan. 15, 2010

(65) Prior Publication Data

US 2010/0181890 A1  Jul. 22, 2010

(30) Foreign Application Priority Data

Jan. 17, 2009  (TW) .............................. 98101802 A (51) Int. Cl.
*F21V 21/00* (2006.01)
(52) U.S. Cl. ................... 362/249.02; 362/294; 362/218; 257/88; 257/99; 257/712
(58) Field of Classification Search ............. 362/249.02, 362/218, 294; 257/88, 99, E33.056, E33.066, 257/712; 313/46
See application file for complete search history.

(56) References Cited

U.S. PATENT DOCUMENTS

| | | | |
|---|---|---|---|
| 5,049,527 A | 9/1991 | Merrick et al. | |
| 6,480,389 B1 | 11/2002 | Shie et al. | |
| 6,498,355 B1 | 12/2002 | Harrah et al. | |
| 6,999,318 B2 * | 2/2006 | Newby | 361/719 |
| 7,201,511 B2 | 4/2007 | Moriyama et al. | |
| 7,560,748 B2 * | 7/2009 | Ishizaka et al. | 257/99 |
| 7,626,208 B2 | 12/2009 | Yang et al. | |
| 7,629,188 B2 | 12/2009 | Chen et al. | |
| 7,855,395 B2 | 12/2010 | Lee et al. | |
| 7,872,278 B2 * | 1/2011 | Stoyan | 257/99 |
| 2004/0089898 A1 * | 5/2004 | Ruhnau et al. | 257/343 |
| 2006/0141851 A1 | 6/2006 | Matsui et al. | |
| 2008/0019103 A1 | 1/2008 | Kim | |
| 2008/0101067 A1 | 5/2008 | Cariboni et al. | |
| 2008/0130289 A1 | 6/2008 | Takemoto et al. | |
| 2009/0091934 A1 | 4/2009 | Lin | |
| 2009/0097249 A1 | 4/2009 | Lee et al. | |
| 2009/0231849 A1 | 9/2009 | Tseng et al. | |
| 2010/0181890 A1 | 7/2010 | Tseng et al. | |

OTHER PUBLICATIONS

Information about Releated Patents and Patent Applications, see section 6 of the accompanying Information Disclosure Statement Letter, which concerns Related Patents and Patent Applications.

* cited by examiner

*Primary Examiner* — Ali Alavi
(74) *Attorney, Agent, or Firm* — Fox Rothschild, LLP; Robert J. Sacco (57) ABSTRACT

A lighting device includes: at least one lighting module including a lead frame and a plurality of light emitting diodes packaged on the lead frame; an upper plate disposed on the lead frame, and having at least one perforated region formed with a plurality of through-holes for extension of the light emitting diodes therethrough, and at least two conductor regions respectively provided on two sides of the perforated region, the conductor regions being connected electrically to the lead frame; a heat sink disposed below the lead frame; and a plurality of fasteners fastening the lighting module to the upper plate and the heat sink such that the heat sink is in tight contact with bottom ends of the light emitting diodes.

20 Claims, 6 Drawing Sheets

LIGHTING DEVICE AND METHOD FOR MAKING THE SAME

CROSS-REFERENCE TO RELATED APPLICATION

This application claims priority to Taiwanese Patent Application No. 090101802, filed on Jan. 17, 2009; which is incorporated herein by reference.

BACKGROUND OF THE INVENTION

1. Field of the Invention

The invention relates to a lighting device and a method for making the same, more particularly to a lighting device including a lead frame with light emitting diodes packaged thereon.

2. Description of the Related Art

Figure 1:
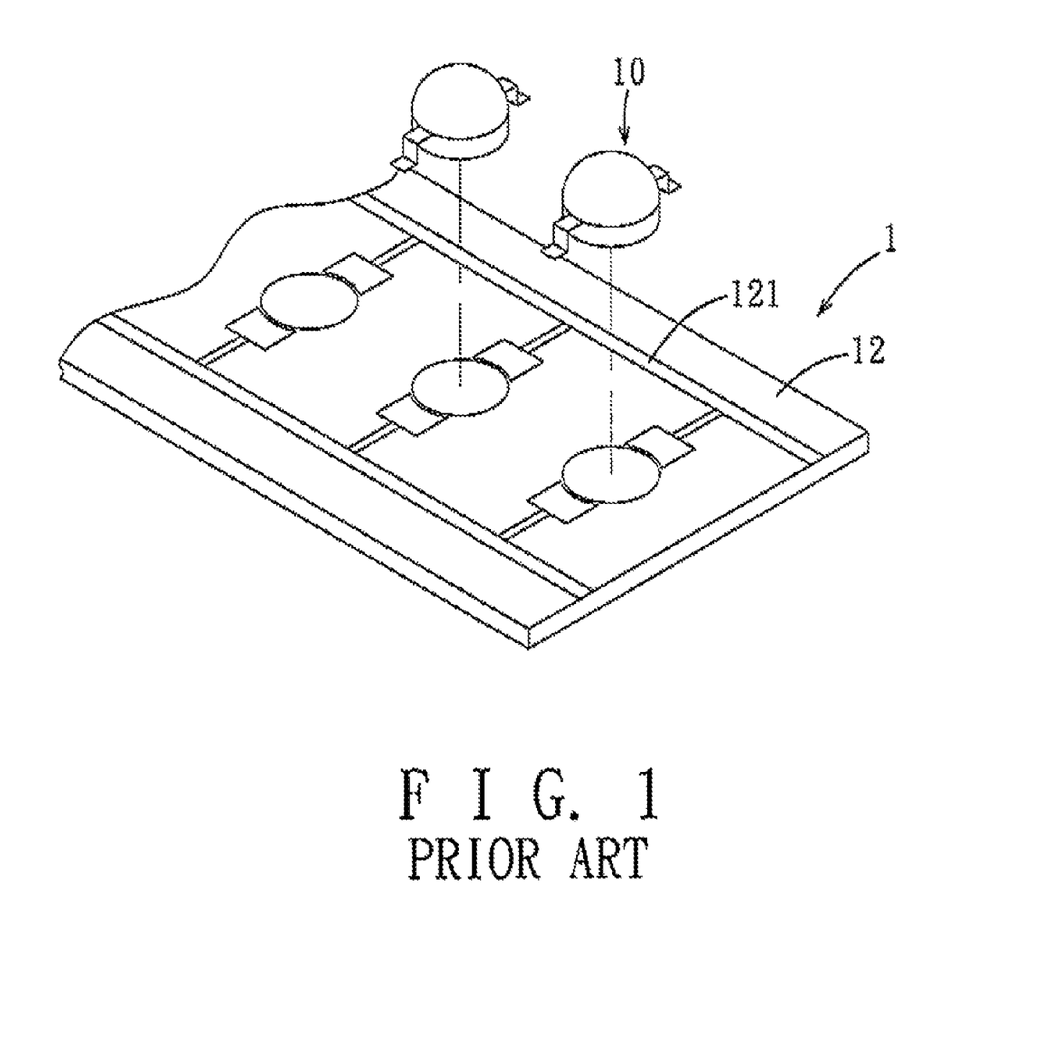
FIG. 1 is a fragmentary exploded perspective view of a lighting module of a conventional lighting device.

Referring to FIG. 1, a lighting module 1 of a conventional lighting device is shown to include a printed circuit board 12 (or a ceramic board) with conductive traces 121, and a plurality of light emitting diodes 10 (hereinafter referred as LEDs) soldered to and arranged on the printed circuit board 12 so as to be connected to each other in series and/or parallel through the conductive traces 121. For reference, such lighting module 1 is disclosed in, for example, U.S. Pat. Nos. 6,480,389B1, and 6,498,355B1.

The LEDs 10 of the conventional lighting module 1 can be formed using any well-known method. For example, the LEDs 10 can be formed by respectively attaching light emitting diode dies (not shown) to a plurality of die mounting parts of a lead frame or a stamped metal sheet (not shown), and packaging each of the light emitting diode dies using an encapsulant or lens (not shown). The packaged LEDs 10 are removed singly from the lead frame and then placed in an array on the printed circuit board 12 to proceed with a soldering step.

However, the soldering step requires a reflow soldering process, which is not only complicated but also can encounter an incidence of false soldering, generate high temperature heat that can damage the LEDs 10, and produce poor solder connections between the LEDs 10 and the printed circuit board 12. Besides, since the printed circuit board 12 is not heat conductive and is usually disposed between the LEDs 10 and a heat sink (not shown), it can interrupt heat conduction from the LEDs 10 to the heat sink, thereby reducing thermal dissipation and shortening the service life of the LEDs 10.

SUMMARY OF THE INVENTION

Therefore, an object of the present invention is to provide a method for making a lighting device that can overcome the aforesaid drawbacks associated with the prior art.

Another object of the present invention is to provide a lighting device that dispenses with the need for soldering LEDs on a printed circuit board.

According to a first aspect of the present invention, there is provided a lighting device that comprises: at least one lighting module including a lead frame that has a plurality of die mounting parts, a plurality of pairs of poles, and a plurality of light emitting diodes respectively packaged on the die mounting parts and each connected electrically to one of the pairs of poles; an upper plate disposed on the lead frame, and having at least one perforated region formed with a plurality of through-holes for extension of the light emitting diodes therethrough, and at least two side conductor regions respectively provided on two sides of the perforated region, the side conductor regions being connected electrically to the lead frame; a heat sink disposed below the lead frame, and having a heat-dissipating plate; and a plurality of fasteners fastening the lead frame and the upper plate to the heat sink such that the heat sink is in tight contact with bottom ends of the light emitting diodes.

According to a second aspect of the present invention, there is provided a lighting device that comprises: at least two lighting modules each including a lead frame that has a plurality of die mounting parts, a plurality of pairs of poles, and a plurality of light emitting diodes each of which is packaged on one of the die mounting parts and connected electrically to one of the pairs of poles; an upper plate disposed on the lead frames, and having a middle conductor region and at least two perforated regions separated by the middle conductor region, each of the perforated regions having a plurality of through-holes for extension of the light emitting diodes packaged on one of the lead frames, the middle conductor region being connected electrically to both of the lead frames of the two lighting modules; a heat sink disposed below the lead frames, and having a heat-dissipating plate; and a plurality of fasteners fastening the lead frame and the upper plate to the heat sink such that the heat sink is in tight contact with bottom ends of the light emitting diodes.

According to a third aspect of the present invention, there is provided a method for making a lighting device, comprising: (a) providing two lighting modules, each of which includes a lead frame and a plurality of light emitting diodes that are connected to each other in series and parallel; (b) providing an upper plate having a conductor region; and (c) assembling the upper plate with the two lighting modules such that the two lighting modules are positioned on two sides of and are connected electrically to the conductor region.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Referring to FIGS. 2 and 5~8, a lighting device according to the first preferred embodiment of this invention is shown to include two lighting modules 2, upper and lower plates 3, 4, a heat sink 5, plurality of fasteners 6, and a plurality of conducting wires 7.

Figure 2:
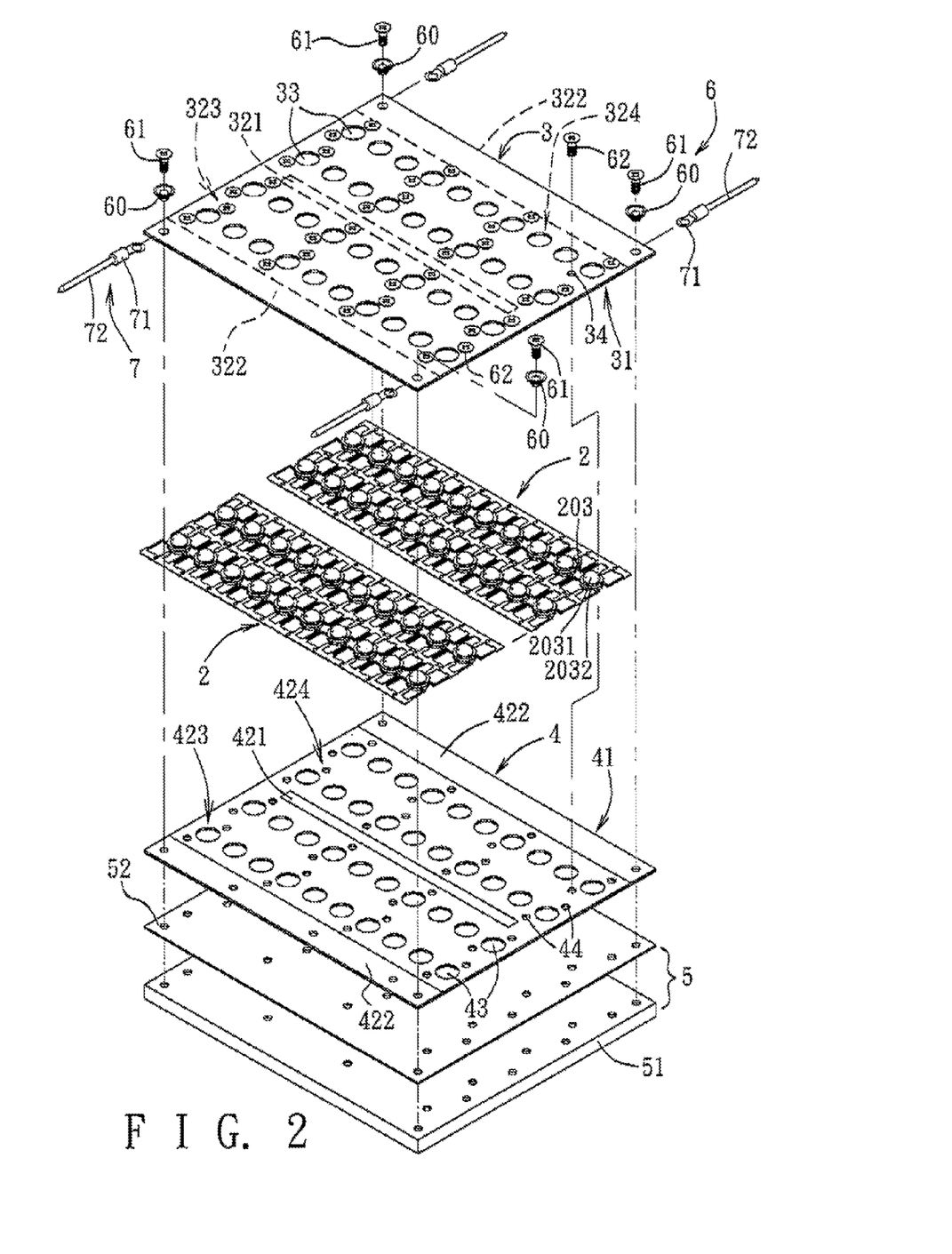
FIG. 2 is an exploded perspective view of the first preferred embodiment of a lighting device according to the present invention.

The two lighting modules 2 are juxtaposed, and each of the lighting modules 2 includes a lead frame 201 and a plurality of light emitting diodes (hereinafter referred as LEDs) 203. The lead frame 201 has a plurality of die mounting parts 204, and a plurality of pairs of poles 202. Each of the LEDs 203 is connected electrically to one pair of the poles 202 and is packaged on one of the die mounting parts 209, thereby having a transparent part 2031 and a bottom end 2032. The LEDs 203 are formed by packaging LED dies (not shown) using any well-known method, and are connected to each other in series and parallel through the poles 202 of the lead frame 201.

The upper plate 3 is disposed on the two juxtaposed lead frames 2 and has a middle conductor region 321 on a lower surface 31 of the upper plate 3, and two perforated regions 323, 324 separated by the middle conductor region 321. Each of the perforated regions 323, 324 has a plurality of through-holes 33 for extension of the LEDs 203 packaged on one of the lead frames 201 of the two light modules 2. The upper plate 3 further has a plurality of locking holes 39 for extension of the fasteners 6. In other words, each of the lighting modules 2 extends through one of the perforated regions 323, 324. The middle conductor region 321 is connected electrically to both of the lead frames 201 of the two lighting modules 2.

The upper plate 3 further has two side conductor regions 322 provided respectively on two sides of an area that includes the two perforated regions 323, 324, and connected electrically and respectively to the two lead frames 201. Thus, the middle conductor region 321 and the side conductor regions 322 are spaced apart from each other by the two perforated regions 323, 324, and each of the lead frames 201 is disposed between the middle conductor region 321 and one of the side conductor regions 322.

The lower plate 4 has a construction symmetrical to that of the upper plate 3 (see FIGS. 2 and 6) and is disposed between the lead frames 201 and the heat sink 5. On an upper surface 41 of the lower plate 4, a middle conductor region 421 and two side conductor regions 422 are formed, all of which are aligned with those on the lower surface 31 of the upper plate 3. The lower plate 4 further has two perforated regions 423, 424, a plurality of through-holes 43, and a plurality of locking holes 44, and all of them are also aligned with those of the upper plate 3.

Figure 6:
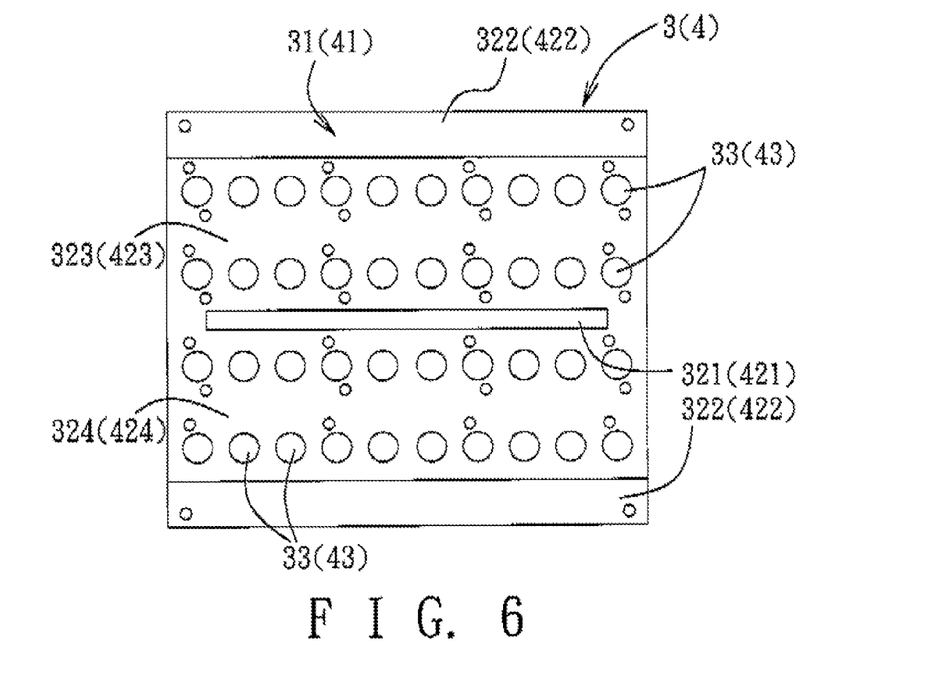
FIG. 6 is a schematic view showing a lower surface of an upper plate (or an upper surface of a lower plate) of the lighting device.

The middle conductor region 421 is connected electrically to both of the lead frames 201 of the two lighting modules 2. The two side conductor regions 422 are connected electrically and respectively to the lead frames 201. The middle conductor region 921 is provided between the two perforated regions 423, 424. Each of the perforated regions 423, 424 is disposed between one of the side conductor regions 422 and the middle conductor region 421. The through-holes 43 permit the bottom ends 2032 of the LEDs 203 to extend therethrough and contact the heat sink 5. The locking holes 44 are for extension of the fasteners 6.

In the preferred embodiment, on the upper and lower plates 3, 4, each of the middle and side conductor regions 321, 322, 421, 422 has conductors (not shown). For example, the conductors can be etched copper traces formed on the plates 3, 4, or a conductive coating coated on the plates 3, 4.

The heat sink 5 is disposed below the lead frames 201, and has a heat-dissipating plate 51, and a heat transfer layer 52 arranged between the LEDs 203 and the heat-dissipating plate 51.

Preferably, the heat-dissipating plate 51 is made from aluminum or copper. Furthermore, the heat transfer layer 52 is a thermal conductive paste or a thermal conductive film (for example, a heat-dissipating film/sheet made of silica gel), and preferably provides elasticity.

The fasteners 6 fasten the lighting modules 2 to the upper and lower plates 3, 4 and the heat sink 5 such that the heat transfer layer 52 is in tight contact with the bottom ends 2032 of the LEDs 203 and the heat-dissipating plate 51. By means of the fasteners 6, the lighting modules 2 are clamped between the upper and lower plates 3, 4.

Each of the conducting wires 7 has a conductive terminal 71 connected electrically to one of the lead frames 201 and a wire body 72 for electrical connection with an outer power source. In the preferred embodiment, each of the conductive terminals 71 is an R terminal.

In this embodiment, each of the conductive terminals 71 of the conducting wires 7 is in the form of a ring for extension of one of the fasteners 6. The fasteners include fasteners 61, insulating sleeves 60 and fasteners 62. The fasteners 61 and the insulating sleeves 60 are disposed at four corners of the upper and lower plates 3, 4. The fasteners 61, 62 in this embodiment are metal screws. Alternatively, the metal screws may be replaced with rivets or other fastening elements. In assembly, the fasteners 61 and 62 extend through the upper and lower plates 3, 4, the lighting modules 2 and the heat transfer layer 52, and are secured to the heat dissipating plate 51. As a result, the poles 202 of some of the LEDs 203 on the two lead frames 201 are in electrical contact with the respective conductors of the middle conductor regions 321, 421 of the upper and lower plates 3, 4. The poles 202 of the remaining LEDs 203 on the two lead frames 201 are in electrical contact with the respective conductors of the side conductor regions 322, 422. The conductive terminals 71 of the conducting wires 7 are secured and electrically connected to the side conductor regions 322, 422 by means of the fasteners 6.

When the conducting wires 7 are connected to a power source, the conducting wires 7 can be connected electrically to the LEDs 203 through the side conductor regions 322, 422, or directly to the poles 202 of the LEDs 203 proximate to the side conductor regions 322, 422. In addition, an electrical connection can be established between the two lighting modules 2 through the middle conductor regions 321, 421. Therefore, an electrical connection can be provided for the lighting modules 2 without using any solder connection.

In order to avoid short-circuiting when using the lighting device of the present invention, the fasteners 61 (metal screws) are isolated electrically from the lead frames 201, the side conductor regions 322, 422, and the heat sink 5 by using the insulating sleeves 60. If non-metallic screws are used in place of the metal screws, the insulating sleeves 60 can be dispensed with. On the other hand, the fasteners 62 extend through the locking holes 34, 44 which are provided in the perforated regions 323, 324, 423, 424 and not in the side conductor regions 322, 422. Further, the fasteners 62 do not contact the lead frames 201 when passing through the lead frames 201. Therefore, even if the fasteners 62 are metal, the fasteners 62 can be isolated electrically from the lead frames 201 and the side conductor regions 322, 422. Of course, the fasteners 62 may be made of an insulating material.

Although the lighting device of the first preferred embodiment includes two lighting modules 2, the number of the lighting modules 2 should not be limited to two. It is possible to use the upper plate 3 only, i.e., the lower plate 4 may be omitted in other embodiments. Besides, the number of the lighting modules 2 may be increased to be more than two. When the number of the lighting modules 2 is increased, the number of the middle conductor region 321 should be increased so as to increase electrical connections between the lighting modules 2. In any case, only the two lighting modules 2 disposed at two outermost sides are needed to connect electrically to the conducting wires 7.

Figure 3:
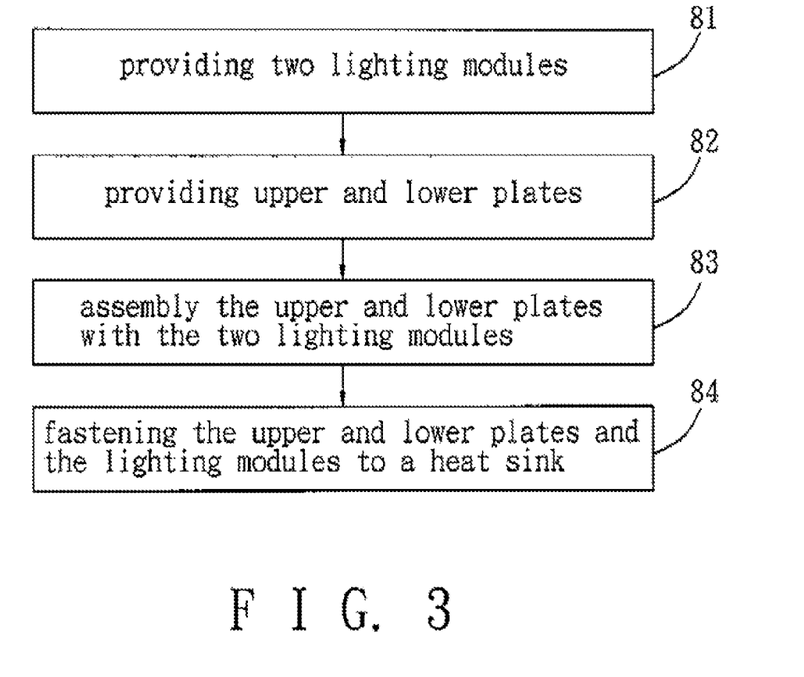
FIG. 3 is a flow chart showing a method of making the lighting device according to the present invention.

FIG. 3 illustrates consecutive steps of a method for making the lighting device of the first embodiment. The method includes: step 81 of providing two lighting modules 2, step 82 of providing upper and lower plates 3, 4, step 83 of assembling the upper and lower plates 3, 4 with the two lighting modules 2, and step 84 of fastening the upper and lower plates 3, 4 and the lighting modules 2 to a heat sink 5.

Figure 4:
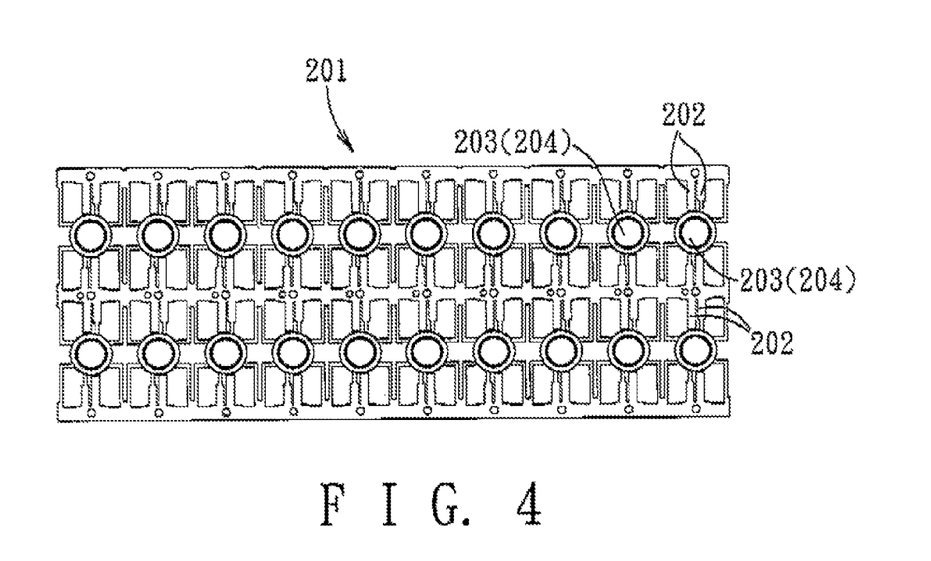
FIG. 4 is a schematic top view of a lead frame and packaged LEDs of the lighting device before a cutting process.
Figure 5:
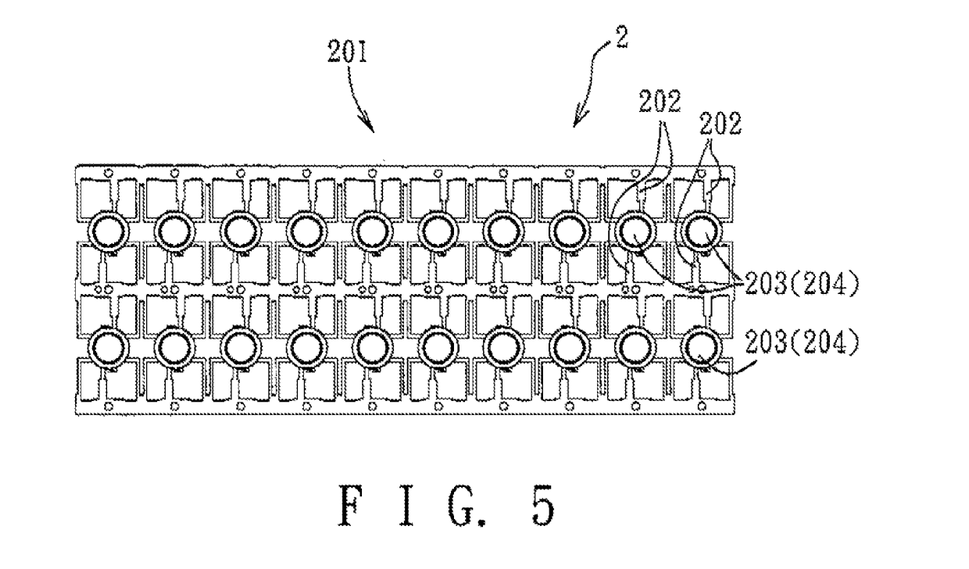
FIG. 5 is the same view as FIG. 4 but illustrating that some poles of the lead frame are cut off.

In step 81, each of the two lighting modules 2 is prepared as follows. Firstly, a metal sheet (not shown) is stamped to form a lead frame 201 having a plurality of die mounting parts 204 and a plurality of pairs of poles 202. Then, a plurality of LED dies (not shown) are packaged on the lead frame 201 using a known method so as to form a plurality of LEDs 203 respectively on the die mounting parts 204. In this state, each of the LEDs 203 as formed is connected to more than one pair of the poles 202 (see FIG. 4). Thereafter, some pairs of the poles 202 of the lead frame 201 are cut off so that each of the LEDs 203 is connected to only one pair of the poles 202 and so that the LEDs 203 are connected to each other in series and parallel through the remaining pairs of the poles 202 (see FIG. 5). In other words, in this invention, after some pairs of the poles 202 are cut off, the lead frame 201 forms an electrical circuit that connects the packaged LEDs 203 in series and parallel. There is no requirement of soldering the LEDs 203 on a printed circuit board. Of course, the positions and the numbers of the poles 202 which should be cut off are determined by the required connecting modes of the LEDs 203, and should not be limited to the embodiment of this invention.

In step 82, upper and lower plates 3, 4 are provided, and both of them are printed circuit boards, each of the printed circuit boards having an insulator plate (or a ceramic board) and copper traces thereon. Each of the upper and lower plates 3, 4 is prepared by etching a copper foil formed on one of the upper and lower plates 3, 4 so that etched copper traces are formed in the middle and side conductor regions 321, 322, (421, 422) (see FIG. 6). However, the formation of the conductors on the conductor regions 321, 322 421, 422 should not be limited to the etching process. For example, the conductor regions 321, 322 (421, 422) can be prepared by forming a conductive coating on the lower (upper) surfaces 31 (41) of the upper (lower) plates 3 (4).

Figure 8:
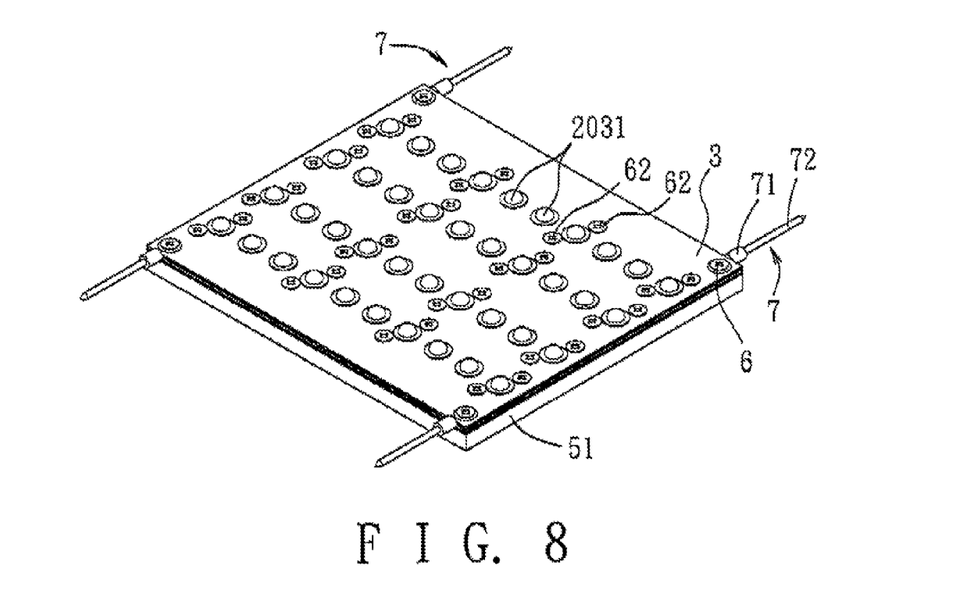
FIG. 8 is a perspective view of the first preferred embodiment of the lighting device in an assembled state.

In step 83, the upper and lower plates 3, 4 are assembled with the two lighting modules 2 so that the two lighting modules 2 are positioned on two sides of and are connected electrically to the middle conductor region 321, 421 of the upper and lower plates 3, 4.

in step 84, as shown in FIG. 8, the upper and lower plates 3, 4, the lighting modules 2, and the conductive terminals 71 of the conducting wires 7 are fastened to the heat sink 5 using the fasteners 6, such that the heat transfer layer 52 of the heat sink 5 is in tight contact with the bottom ends 2032 of the LEDs 203 and the heat-dissipating plate 51 of the heat sink 5. Further, the lighting modules 2 are clamped between the upper and lower plates 3 and 4, and are disposed over the heat sink 5.

Figure 7:
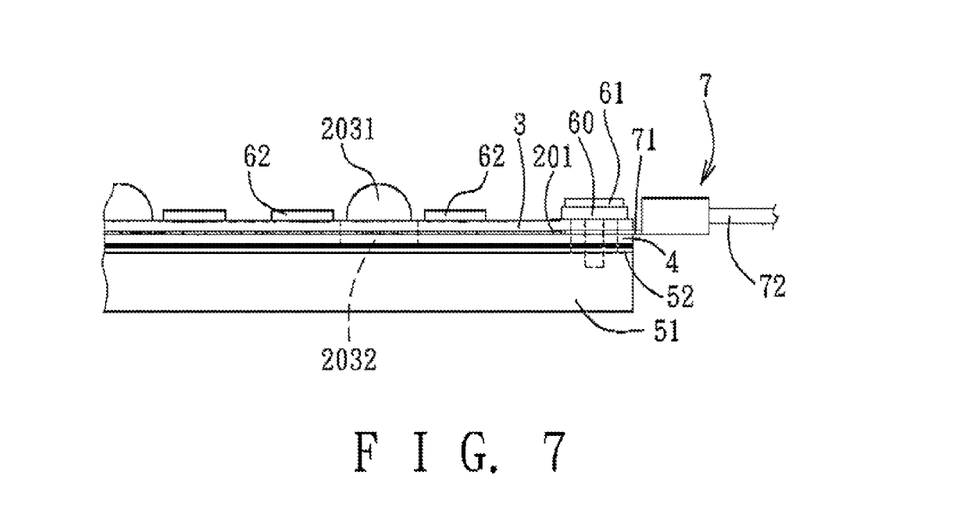
FIG. 7 is a fragmentary side view of the lighting device according to the present invention.

It should be noted that each of the LEDs 203 has its bottom end 2032 larger than its transparent part 2031 (see FIG. 7). Each of the through-holes 33 of the upper plate 3 has a diameter slightly smaller than (or substantially equal to) that of the bottom end 2032 of the respective LED 203. The transparent parts 2031 of the LEDS 203 extend upwardly from the upper side of the upper plate 3, and the bottom ends 2032 extend downwardly from the upper plate 3 into the lower plate 4. When the fasteners 61 and 62 are tightened, the tightening force can force the upper plate 3 to press the bottom ends 2032 of the LEDs 203 so that the bottom ends 2032 contact against the heat transfer layer 52. In addition, because the heat transfer layer 52 is elastic, it is deformed and thinned by the tightening force and tightly contacts the bottom ends 2032 of the LEDs 203 and the heat-dissipating plate 51, thereby increasing the contact areas among the bottom ends 2032 of the LEDs 203 and the heat transfer layer 52 and enhancing heat transfer and heat dissipating effects.

Furthermore, although the upper and lower plates 3, 4 used in the preferred embodiment are printed circuit boards, there is no solder connection among the upper and lower plates 3, 4, the conductive wires 7 and the lighting modules 2, since the electrical connections in the lighting device are established by virtue of the fasteners 6.

Figure 9:
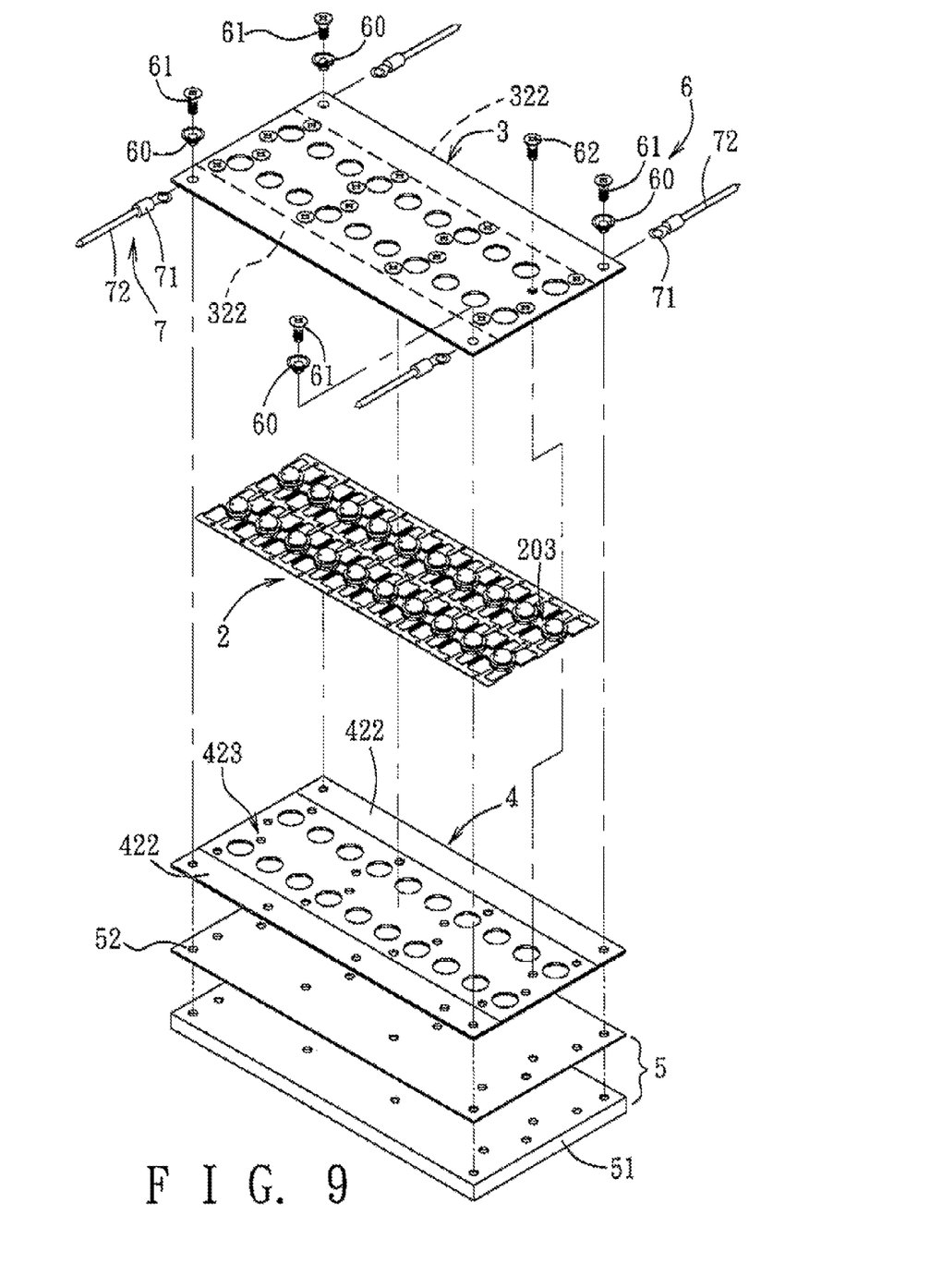
FIG. 9 is an exploded perspective view of the second preferred embodiment of a lighting device according to the present invention.

FIG. 9 illustrates the second preferred embodiment of the lighting device according to this invention. The second preferred embodiment differs from the previous embodiment in that only one lighting module 2 is provided in the lighting device, that each of the upper and lower plates 3, 4 has only one perforated region 323 (423), and that the middle conductor regions 321, 421 of the upper and lower plates 3, 4 of the previous embodiment are omitted.

Since the printed circuit board 12 employed in the conventional lighting module 1 is replaced by the lead frames 201 having the LEDs 203 packaged thereon, and since the middle and side conductor regions 321, 421, 322, 422 on the upper and/or lower plates 3, 4 can provide electrical connections between the LEDs 203 and the conducting wires 7, it is not necessary to use the complicated reflow soldering or any other soldering process for the lighting device of the present invention. Therefore, the problems encountered in the prior art can be alleviated.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:
1. A lighting device comprising:
at least one lighting module including a lead frame that has a plurality of die mounting parts, a plurality of pairs of poles, and a plurality of light emitting diodes respectively packaged on said die mounting parts and each connected electrically to one of said pairs of poles;
an upper plate disposed on said lead frame, and having at least one perforated region formed with a plurality of through-holes for extension of said light emitting diodes therethrough, and at least two side conductor regions respectively provided on two sides of said perforated region, said side conductor regions being connected electrically to said lead frame;
a heat sink disposed below said lead frame, and having a heat-dissipating plate; and
a plurality of fasteners fastening said lead frame and said upper plate to said heat sink such that said heat sink is in tight contact with bottom ends of said light emitting diodes.

2. The lighting device of claim 1, wherein said heat sink further has a heat transfer layer arranged between said bottom ends of said light emitting diodes and said heat-dissipating plate.

3. The lighting device of claim 1, further comprising a plurality of conducting wires each having a conductive terminal connected electrically to said lead frame.

4. The lighting device of claim 1, further comprising a lower plate disposed between said lead frame and said heat sink and having at least one perforated region formed with a plurality of through-holes that permit said light emitting diodes to extend therethrough and contact said heat sink, said lead frame being clamped between said upper and lower plates.

5. The lighting device of claim 4, wherein said lower plate further has at least two side conductor regions respectively provided on two sides of said perforated region of said lower plate and connected electrically to said lead frame.

6. The lighting device of claim 4, wherein at least one of said upper and lower plates is a printed circuit board, and has said side conductor regions formed with etched copper traces.

7. The lighting device of claim 4, wherein at least one of said upper and lower plates has said side conductors regions formed with a conductive coating.

8. The lighting device of claim 1, wherein each of said fasteners has a metal screw and an insulating sleeve surrounding said metal screw.

9. The lighting device of claim 1, wherein each of said fasteners is an insulating screw.

10. The lighting device of claim 1, which comprises two said lighting modules that are juxtaposed, said upper plate having two said perforated regions, and two said side conductor regions, and further having a middle conductor region between said side conductor regions, each of said lighting modules extending through one of said perforated regions, said middle conductor region being provided between two said perforated regions, each of said perforated regions being disposed between one of said side conductor regions and said middle conductor region.

11. The lighting device of claim 1, wherein each of said light emitting diodes has a transparent part extending upwardly from said upper plate, said bottom ends of said light emitting diodes extending downwardly from said upper plate, said upper plate pressing said bottom ends of said light emitting diodes when said upper plate is fastened to said heat sink.

12. A lighting device comprising:
at least two lighting modules each including a lead frame that has a plurality of die mounting parts, a plurality of pairs of poles, and a plurality of light emitting diodes each of which is packaged on one of said die mounting parts and connected electrically to one of said pairs of said poles;
an upper plate disposed on said lead frames, and having a middle conductor region, and at least two perforated regions separated by said middle conductor region, each of said perforated regions having a plurality of through-holes for extension of said light emitting diodes packaged on one of said lead frames, said middle conductor region being connected electrically to both of said lead frames of said two lighting modules;
a heat sink disposed below said lead frames, and having a heat-dissipating plate; and
a plurality of fasteners fastening said lead frame and said upper plate to said heat sink such that said heat sink is in tight contact with bottom ends of said light emitting diodes.

13. The lighting device of claim 12, wherein said upper plate further has two side conductor regions which are connected electrically and respectively to said lead frames, each of said lead frames being disposed between said middle conductor region and one of said side conductor regions.

14. The lighting device of claim 12, further comprising a lower plate disposed between said lead frames and said heat sink, and having at least two perforated regions having a plurality of through-holes which permit said light emitting diodes of said lighting modules to extend therethrough and contact said heat sink, said lighting modules being clamped between said upper and lower plates.

15. The lighting device of claim 14, wherein said lower plate further has a middle conductor region and two side conductor regions aligned respectively with said middle and side conductor regions of said upper plate, said middle conductor region of said lower plate being connected electrically to both of said lead frames, said side conductor regions of said lower plate being connected electrically and respectively to said lead frames.

16. A method for making a lighting device, comprising:
(a) providing two lighting modules, each of which includes a lead frame and a plurality of light emitting diodes that are connected to each other in series and parallel;
(b) providing an upper plate having a conductor region; and
(c) assembling the upper plate with the two lighting modules such that the two lighting modules are positioned on two sides of and are connected electrically to the conductor region.

17. The method of claim 16, wherein, in step (a), each of the lighting modules is prepared by: (i) stamping a metal sheet to form a lead frame having a plurality of die mounting parts, and a plurality of pairs of poles: (ii) packaging a plurality of light emitting diode dies respectively on the die mounting parts; and (iii) cutting off some pairs of the poles such that the light emitting diodes are connected to each other in series and parallel through the remaining pairs of the poles.

18. The method of claim 17, further comprising fastening the upper plate and the lighting modules to a heat sink.

19. The method of claim 16, wherein, in step (b), the conductor region of the upper plate is formed by etching a copper foil formed on a surface of the upper plate.

20. The method of claim 16, wherein, in step (b), the conductor region of the upper plate is formed by forming a conductive coating on a surface of the upper plate.

* * * * *